US006552612B1

United States Patent
Wilson

(12) United States Patent
(10) Patent No.: US 6,552,612 B1
(45) Date of Patent: Apr. 22, 2003

(54) STEPPED GAIN AMPLIFIER WITH IMPROVED ATTENUATION

(75) Inventor: Timothy J. Wilson, Lancashire (GB)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/955,399

(22) Filed: Sep. 18, 2001

(51) Int. Cl.[7] ................................................. H03F 3/45
(52) U.S. Cl. ....................................... 330/254; 330/292
(58) Field of Search ................................ 330/252, 254, 330/292; 327/359

(56) References Cited

U.S. PATENT DOCUMENTS 5,903,185 A * 5/1999 Cargill ......................... 330/252
5,926,068 A * 7/1999 Harr ............................ 330/254

* cited by examiner

Primary Examiner—Robert Pascal
Assistant Examiner—Khanh Van Nguyen
(74) Attorney, Agent, or Firm—Westman, Champlin & Kelly

(57) ABSTRACT

A switched gain differential amplifier is provided which includes first and second differential transconductance amplifier stages and a disabled dummy differential transconductance amplifier stage. The first and second differential transconductance amplifier stages have respective differential inputs that are coupled in-phase to one another and respective differential outputs that are coupled in-phase to one another. At least one of the stages is selectively enabled. The disabled dummy differential transconductance amplifier stage has a differential input coupled in-phase to the differential inputs of the first and second differential transconductance amplifier stages and a differential output cross-coupled out-of-phase to the differential outputs of the first and second differential transconductance amplifier stages. A common load circuit coupled to the differential outputs of the first and second differential transconductance amplifier stages and the disabled dummy differential transconductance amplifier stage.

17 Claims, 4 Drawing Sheets

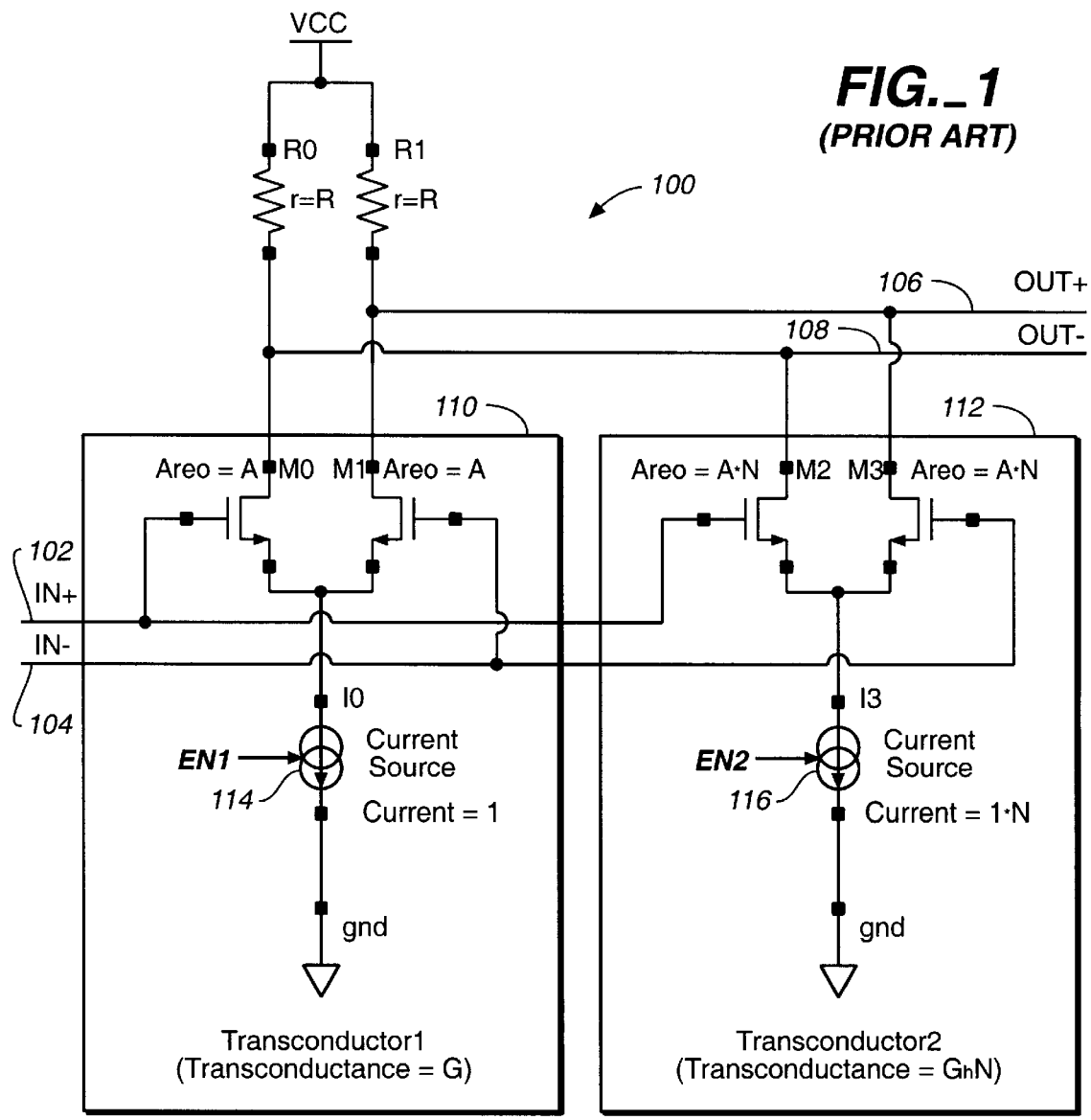
FIG._1
(PRIOR ART)

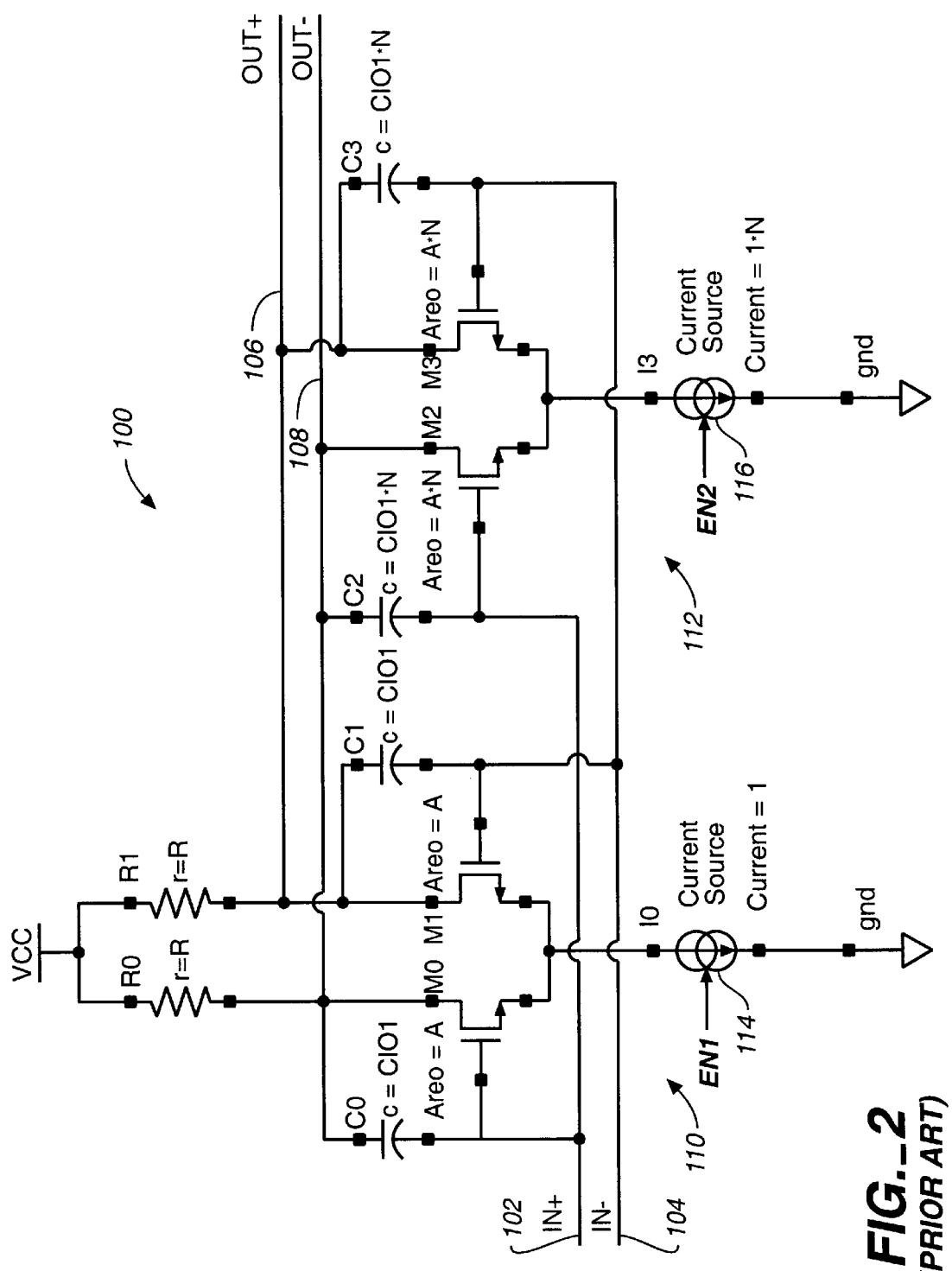
FIG._2
(PRIOR ART)

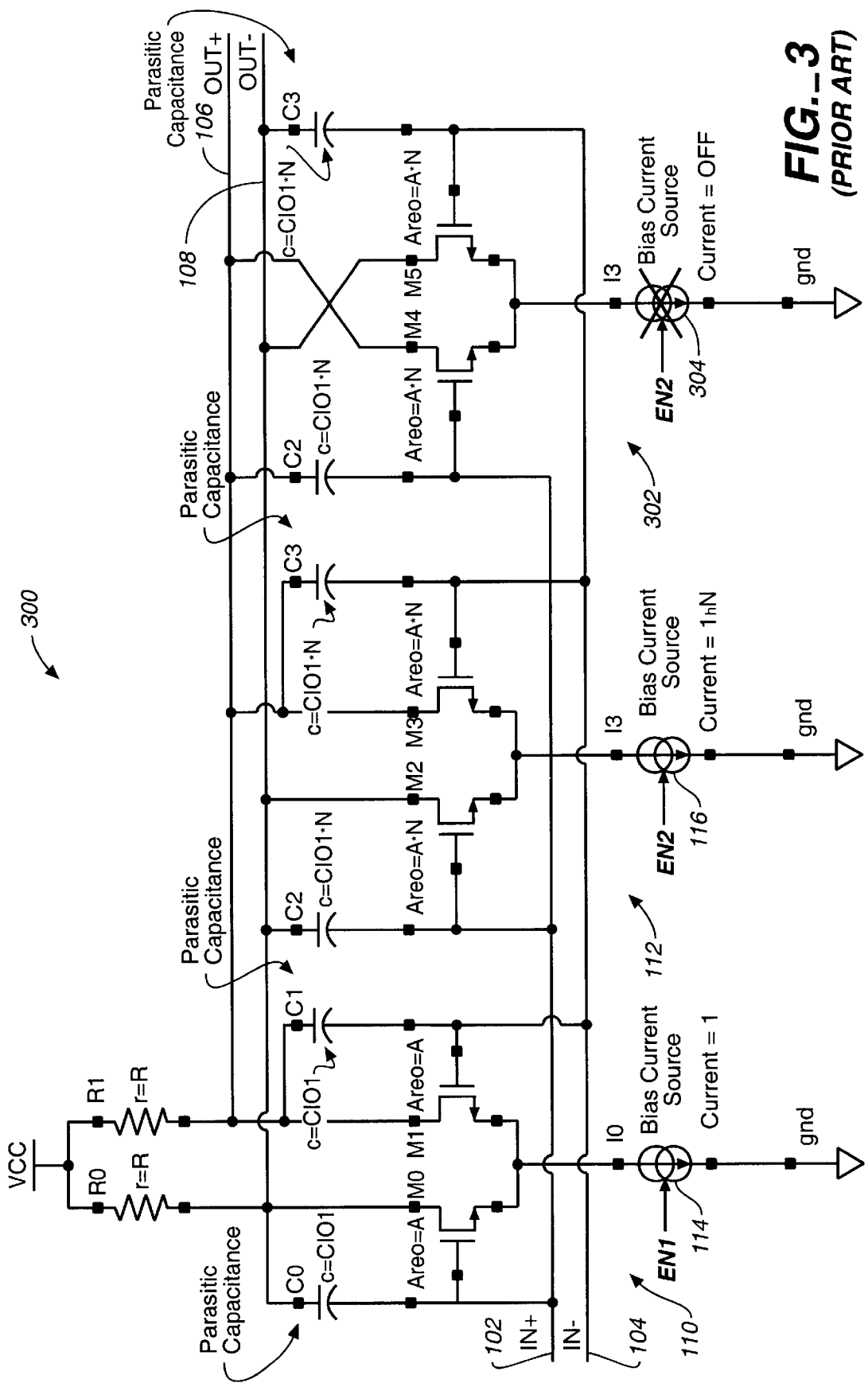
FIG._3 (PRIOR ART)

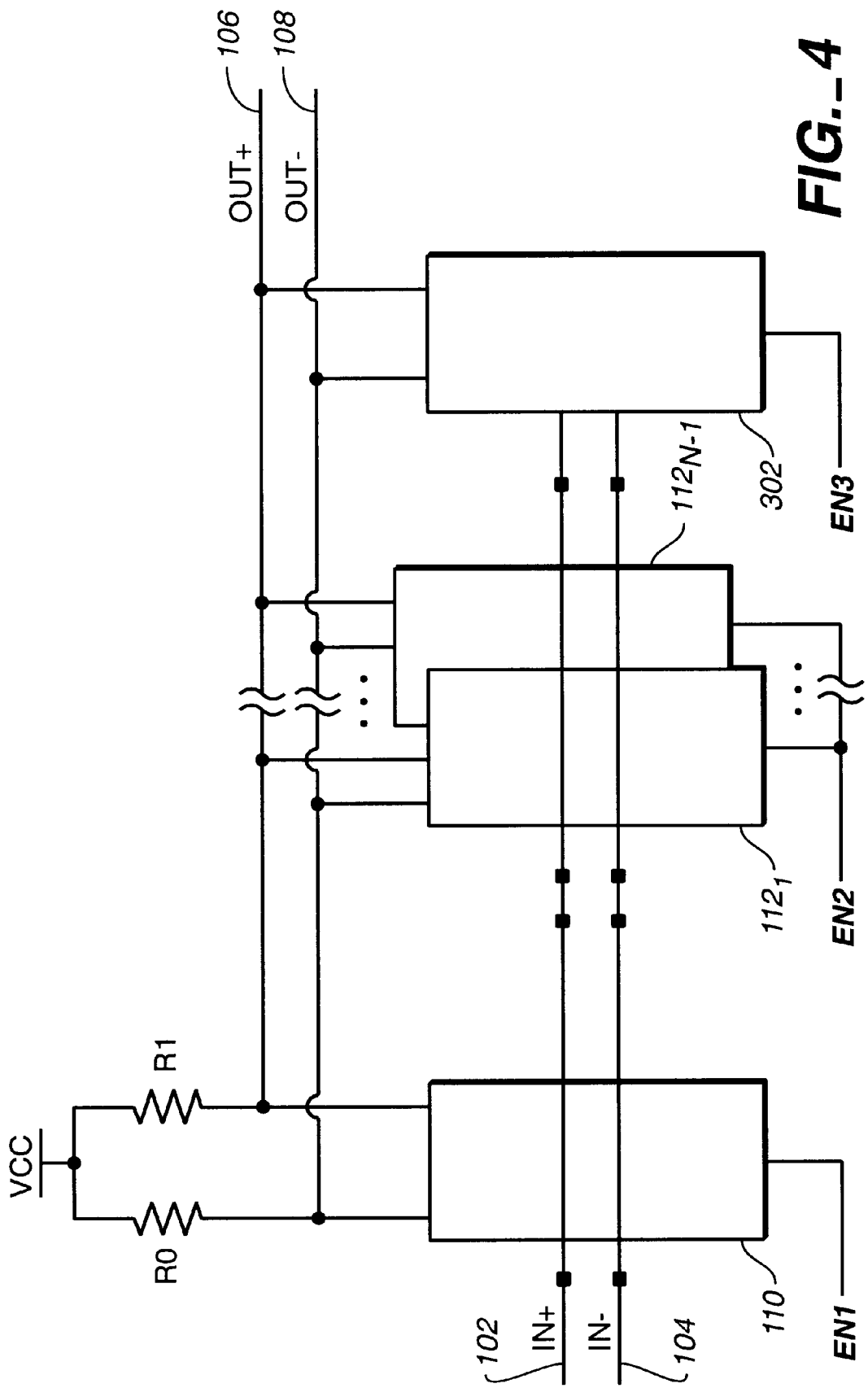
FIG._4

US 6,552,612 B1

STEPPED GAIN AMPLIFIER WITH IMPROVED ATTENUATION

FIELD OF THE INVENTION

The present invention relates to data communication receivers and, more particularly, to a stepped gain amplifier having improved attenuation.

BACKGROUND OF THE INVENTION

Low noise amplifiers (LNAs) are often used for the front-end of data communication receivers, such as satellite receivers for digital TV, which are commonly referred to as set-top boxes (STBs). The purpose of a low noise amplifier is to boost the strength of the signal received from an aerial antenna before further signal processing is attempted. Signals received from aerial antennas typically have large dynamic ranges, such as 50 dB in the STB case.

Conventional circuit configurations in these applications include a fixed gain LNA followed by a variable gain amplifier (VGA). The VGA allows the dynamic range of the signal presented to the subsequent processing blocks to be reduced, which enables operation at more optimum signal levels. The VGA is typically capable of both amplifying and attenuating the signal, as determined by its control input.

One problem with the conventional circuit configuration relates to limitations imposed by the power supply. If the received signal amplitude is very small, a high gain LNA can be used to optimize the signal-to-noise ratio. However if the received signal amplitude is large, the high gain LNA would attempt to amplify the signal amplitude above the level of the power supply voltage rails. This results in signal distortion. A compromise is therefore required, and the maximum fixed gain that can be applied in the LNA is limited by the supply voltage level.

When discrete transistors were used to implement LNAs, this limitation was not too severe. However with the desire for higher levels of circuit integration, the LNA circuitry has been moved on-chip. Therefore more stringent supply voltage limitations are applied to the maximum gains of embedded LNAs. As process technology improves, the supply voltages on integrated circuits have continued to reduce, and the limitations become more severe. For example, the core supply voltages for complementary metal oxide semiconductor (CMOS) circuits have recently been reduced from 5 Volts to voltages such as 3.3 Volts, 2.5 Volts and 1.5 Volts.

One design for working around this limitation includes the use of a switched gain LNA. A switched gain LNA avoids amplifying large input signals and reduce the dynamic range of the input signals as early as possible in the signal chain. One implementation of a switched gain LNA includes a pair of differential transconductor amplifiers which share common load networks. By using common load networks, the transconductance of each amplifier is proportionately translated into gain. In the simplest implementation, only one of the transconductance amplifiers is enabled at any one time. Gain changing is achieved by scaling the transconductances of the two amplifiers relative to one another. For input signals having a low amplitude, the amplifier having a high transconductance is enabled. For input signals having high amplitudes, the amplifier having a low transconductance is enabled. This prevents the amplifiers from attempting to amplify high input signals above the supply rail voltages.

However, the amplifier having a high transconductance significantly increases the parasitic capacitances that are coupled to the output load of the LNA. These excess parasitic capacitances can cause reduced amplifier bandwidth and can cause frequency response anomalies. Improved switched gain amplifiers are therefore desired.

SUMMARY OF THE INVENTION

One embodiment of the present invention is directed to a switched gain differential amplifier which includes first and second differential transconductance amplifier stages and a disabled dummy differential transconductance amplifier stage. The first and second differential transconductance amplifier stages have respective differential in puts that are coupled in-phase to one another and respective differential outputs that are coupled in-phase to one another. At least one of the stages is selectively enabled. The disabled dummy differential transconductance amplifier stage has a differential input coupled in-phase to the differential inputs of the first and second differential transconductance amplifier stages and a differential output cross-coupled out-of-phase to the differential outputs of the first and second differential transconductance amplifier stages. A common load circuit is coupled to the differential outputs of the first and second differential transconductance amplifier stages and the disabled dummy differential transconductance amplifier stage.

Another embodiment of the present invention is directed to a switched gain differential amplifier having first and second differential transconductance amplifier stages and a dummy differential transconductance amplifier stage. The first and second differential transconductance amplifier stages have respective differential inputs that are coupled in-phase to one another and respective differential outputs that are coupled in-phase to one another. At least one of the first and second stages is selectively enabled and has a parasitic capacitance coupled between the differential input and the differential output of that stage. The dummy differential transconductance amplifier stage is coupled between the differential inputs of the first and second differential transconductance amplifier stages and the differential outputs of the first and second differential transconductance amplifier stages for canceling the parasitic capacitance.

Another embodiment of the present invention is directed to a method of canceling parasitic capacitance in a switched gain differential amplifier. The method includes receiving a differential input signal and amplifying the differential input signal with at least one of first and second differential transconductance amplifier stages. The first and second differential transconductance amplifier stages have differential inputs that are coupled in-phase to one another and differential outputs that are coupled in-phase to one another. At least one of the first or second stages is selectively enabled and has a parasitic capacitance coupled between the differential input and the differential output of that stage. An effect of the parasitic capacitance is canceled with a disabled dummy differential transconductance amplifier stage having a differential input coupled in-phase to the differential inputs of the first and second differential transconductance amplifier stages and a differential output cross-coupled out-of-phase to the differential outputs of the first and second differential transconductance amplifier stages.

BRIEF DESCRIPTION OF THE DRAWINGS

FIG. 1 is a schematic diagram of a typical switched gain low noise amplifier (LNA) of the prior art.

FIG. 2 is a schematic diagram which illustrates parasitic capacitances within the switched gain LNA amplifier shown in FIG. 1.

FIG. 3 is a schematic diagram of a switched gain LNA amplifier according to one embodiment of the present invention.

FIG. 4 is a diagram of a switched gain amplifier with plural amplifier stages coupled in parallel.

DETAILED DESCRIPTION OF ILLUSTRATIVE EMBODIMENTS

FIG. 1 is a schematic diagram of a typical complementary metal oxide semiconductor (CMOS) switched gain low noise amplifier (LNA) of the prior art. Amplifier 100 includes differential inputs 102 and 104 (labeled "IN+" and "IN−"), differential outputs 106 and 108 (labeled "OUT+" and "OUT−"), differential transconductance amplifier stages 110 and 112 and load networks R0 and R1.

Differential transconductance amplifier stage 110 includes NMOS transistors M0 and M1 and switched tail current source 114. Switched tail current source 114 is coupled in series between the sources of transistors M0 and M1 and ground terminal GND and has an enable input EN1. When enable input EN1 is active, tail current source 114 is enabled and supplies a tail current to the sources of transistors M0 and M1, which is steered through transistors M0 and M1 and load networks R0 and R1 depending on the relative voltage levels on inputs IN+ and IN−. When enable input EN1 is inactive, current source 114 is disabled, which disables amplifier stage 110. Transistors M0 and M1 are coupled together to form a differential transistor pair. The gates of transistors M0 and M1 form first and second differential inputs to amplifier stage 110, and the drains of transistors M0 and M1 form first and second differential outputs from amplifier stage 110. The gate of transistor M0 is coupled to input IN+, and the gate of transistor M1 is coupled to input IN−. The sources of transistors M0 and M1 are coupled to tail current source 114. The drain of transistor M0 is coupled to output OUT−, and the drain of transistor M1 is coupled to output OUT+. Load network R0 is coupled in series between voltage supply terminal VCC and output OUT−. Load network R1 is coupled in series between voltage supply terminal VCC and output OUT+.

Similarly, differential transconductance amplifier stage 112 includes NMOS transistors M2 and M3 and switched tail current source 116. Switched tail current source 116 is coupled in series between the sources of transistors M2 and M3 and ground terminal GND and has an enable input EN2. When enable input EN2 is active, tail current source 116 is enabled and supplies a tail current to the sources of transistors M0 and M1, which is steered through transistors M2 and M3 and load networks R0 and R1 depending on the relative voltage levels on inputs IN+ and IN−. When enable input EN2 is inactive, current source 116 is disabled, which disables amplifier stage 112. Transistors M2 and M3 are coupled together to form a differential transistor pair. The gates of transistors M2 and M3 form first and second differential inputs to amplifier stage 112, which are coupled to inputs IN+ and IN−, respectively, in-phase with the differential inputs to amplifier stage 110. The drains of transistors M2 and M3 form first and second differential outputs from amplifier stage 112, which are coupled to outputs OUT − and OUT+, respectively, in-phase with the differential outputs from amplifier stage 110. The sources of transistors M2 and M3 are coupled to tail current source 116.

Transistors M2 and M3 each have an aspect ratio of "A", and amplifier stage 110 has a transconductance of "G". The variables "A" and "G" can have any suitable value. Load network R0 is coupled in series between voltage supply terminal VCC and output OUT−. Load network R1 is coupled in series between voltage supply terminal VCC and output OUT+.

Switched gain LNA amplifier 100 achieves a switched gain by selectively enabling and disabling at least one of the transconductance amplifier stages 110 and 112, which share common load networks R0 and R1. In the simplest implementation, only one of transconductance amplifier stages 110 and 112 is enabled at one time. The transconductances of amplifier stages 110 and 112 are scaled relative to one another and LNA amplifier 100 switches from one stage to another. For example, if transconductance amplifier 112 is implemented with transistors having ten times the aspect ratio of the transistors in transconductance amplifier 110, and if transconductance amplifier 112 is run with ten times the current of transconductance amplifier 110, the transconductance of amplifier 112 would ideally be ten times higher than the transconductance of amplifier 110. By using common load networks R0 and R1, the transconductance proportionally translates into gain, and the output signal appears at a common point on outputs OUT+ and OUT−.

This example can be expanded to an example where the gain of stage 112 is "N" times the gain of stage 110. If transistors M0 and M1 each have an aspect ratio of "A", then transistors M2 and M3 would have an aspect ratio of "A*N". If current source 114 supplies a current of "I", then current source 116 would be configured to supply a current of "I*N". Thus, transconductance amplifier 110 would have a transconductance of "G", and transconductance amplifier 112 would have a transconductance of "G*N".

For low amplitude input signals received on inputs IN+ and IN−, a large gain would be desired. Low gain stage 110 would be disabled and high gain stage 112 would be enabled to allow the received input signal to be amplified onto outputs OUT+ and OUT− with the high gain provided by stage 112. For high amplitude input signals, a low gain would be desired. Low gain stage 110 would be enabled and high gain stage 112 would be disabled. This prevents LNA amplifier from attempting to amplify the large input signals beyond the voltage supply rails applied across voltage supply terminals VCC and GND.

The difficulty with the architecture shown in FIG. 1 is that the "off" transconductance amplifier stage shares common input and output connections with the active stage and therefore shares any parasitic capacitance that it has between those nodes. FIG. 2 is a schematic diagram which illustrates the parasitic capacitances within switched gain LNA amplifier 100. The same reference numerals are used in FIG. 2 as were used in FIG. 1 for the same or similar elements.

Transistors M0—M3 have parasitic drain-to-gate capacitances (or collector-to-base capacitances for bipolar transistors) C0–C3, respectively. Capacitances C0 and C2 are coupled in series between input IN+ and output OUT−, and capacitances C1 and C3 are coupled in series between input IN− and output OUT+. If the N-to-1 gain example is used, the drain-to-gate capacitances C2 and C3 of transistors M2 and M3 will be "N" times larger than the drain-to-gate capacitances C0 and C1 of transistors M0 and M1. Thus, if capacitances C0 and C1 have a value "$C_{J01}$" and capacitances C2 and C3 have a value "$C_{J02}$", then $C_{J02}=N*C_{J01}$.

In the high gain-mode, low gain transconductance amplifier stage 110 is inactive and high gain transconductance amplifier stage 112 is active. The effect of parasitic capacitance $C_{J01}$ is swamped by the effect of the active high gain transconductance amplifier stage 112. However in the low gain mode, the small gain transconductance amplifier stage 110 is active and the large gain transconductance amplifier stage 112 is inactive. Although large gain transconductance amplifier stage 112 is inactive, its parasitic capacitance $C_{f02}$ is still present and is "N" times larger than that of the active transconductance amplifier stage 110. This excess parasitic capacitance causes two deleterious effects. First, in both gain modes, the bandwidth of LNA amplifier 100 is compromised because of the increased nodal capacitance. Second, particularly for very low or sub-unity gain, at very high frequencies the signal current carried to load networks R0 and R1 through the parasitic capacitances C2 and C3 can exceed that contributed by the active transistor pair M0 and M1. This gives rise to frequency response anomalies, typically manifesting as high frequency peaking.

FIG. 3 is a schematic diagram of a switched gain LNA amplifier 300 which includes a third, dummy transconductance amplifier stage to remove the frequency response anomalies according to one embodiment of the present invention. Again, the same reference numerals are used in FIG. 3 as were used in FIGS. 1–2 for the same or similar elements. In addition to transconductance amplifier stages 110 and 112, LNA amplifier 300 further includes a third, dummy transconductance amplifier stage 302, which is permanently disabled.

Dummy amplifier stage 302 includes tail current source 304 and NMOS transistors M4 and M5. Current source 304 is coupled-in series between the sources of transistors M4 and M5 and ground terminal GND and has an enable input EN3. Enable input EN3 is tied inactive. Transistors M4 and M5 are coupled together to form a differential transistor pair. The gates of transistors M4 and M5 form differential inputs which are coupled to inputs IN+ and IN−, respectively, in-phase with the differential inputs to amplifier stages 110 and 112. The drains of transistors M4 and M5 form differential outputs which are coupled to outputs OUT− and OUT+, respectively, out-of-phase with the differential outputs from amplifier stages 110 and 112.

With the outputs reversed, the parasitic drain-to-gate capacitance C5 associated with transistor M4 is now coupled between input IN+ and output OUT+. The parasitic drain-to-gate capacitance associated with transistor M5 is now coupled between input IN− and output OUT−. When inputs IN+ and IN− are driven with a balanced differential signal, the charge injected in common load networks R0 and R1 by the parasitic capacitor on each phase of the active stage is simultaneously removed by the action of the cross-coupled dummy stage 302. For example, if amplifier stage 110 is active, the charge injected into load network R0 from input IN+ through parasitic capacitance C2 (in inactive stage 112) is cancelled by the charge removed from load network R0 by input IN− through parasitic capacitance C4. In this way, the effect of the nodal capacitance is removed, and signal currents drawn through the load networks via the parasitic capacitances are nulled at all frequencies.

The advantage of using a full dummy amplifier stage to achieve cancellation is that the bias conditions of the active stages are fully replicated so that a more accurate cancellation is achieved. In one embodiment, transistors M4 and M5 have the same aspect ratios (A*N) as transistors M2 and M3 in the larger gain transconductance amplifier 112. The dummy amplifier stage is also entirely passive and therefore adds no noise to the signal and does not draw any supply current. The dummy amplifier stage also does not add any further voltage drops, therefore adding capacitance correction without reducing the available output signal swing across outputs OUT+ and OUT−.

Numerous modifications can be made to amplifier 300 in alternative embodiments of the present invention. For example, amplifier 300 can be implemented in other semiconductor technologies than CMOS, such as with bipolar junction transistors. Also, LNA amplifier 300 shows the simplest case where only one of the transconductor amplifier stages is enabled at any one time. More complex enabling schemes can be used.

Also, if a particular application requires an "N-to-1 gain switch" the switch can be implemented with one amplifier stage having a gain of one unit and another amplifier stage having a gain of N units, where each stage is alternately enabled. Alternatively, such an N-to-1 gain switch can be implemented by using one permanently enabled amplifier stage having a gain of one unit and selectively enabling and disabling another N-1 amplifier stages, each having a gain of one unit. The other N-1 amplifier stages are coupled in parallel with one another between the input and the output (as shown in FIG. 4) and are switched on and off together as a block. In this example, parasitic capacitance cancellation is achieved with a dummy amplifier stage having a gain of N-1 units. Again, this dummy amplifier stage would have its inputs coupled in-phase with the inputs of the active amplifier stages and its outputs reversed with respect to the outputs of the active amplifier stages.

Stated more generically, if the desired transconductance range is M-to-N (where M>N), the amplifier can be implemented with amplifier stages having transconductance values of M and N, respectively, which are alternately enabled. Alternatively, the amplifier can be implemented with a permanently enabled amplifier stage having a transconductance value of N and a switched amplifier stage having a transconductance value of M minus N. Other modifications can also be made.

Although the present invention has been described with reference to preferred embodiments, workers skilled in the art will recognize that changes may be made in form and detail without departing from the spirit and scope of the invention. For example, a variety of different types of amplifier stages and configurations can be used in alternative embodiments of the present invention. These stages can be used in a variety of different applications, including but not limited to low noise amplifiers for communication receivers such as satellite receivers for digital TV. Also, the term "coupled" used in the specification and in the claims can refer to a direct connection or a connection through one or more intermediate elements.

What is claimed is:

1. A switched gain differential amplifier comprising:
    first and second differential transconductance amplifier stages having differential inputs that are coupled in-phase to one another and differential outputs that are coupled in-phase to one another, wherein at least one of the stages is selectively enabled;
    a permanently disabled dummy differential transconductance amplifier stage having a differential input coupled in-phase to the differential inputs of the first and second differential transconductance amplifier stages and a differential output cross-coupled out-of-phase to the differential outputs of the first and second differential transconductance amplifier stages; and
    a common load circuit coupled to the differential outputs of the first and second differential transconductance amplifier stages and the disabled dummy differential transconductance amplifier stage.

2. The switched gain differential amplifier of claim 1 wherein:
    the first and second differential transconductance amplifier stages comprise first and second gains, respectively, and the second gain is greater than the first gain;

the second differential transconductance amplifier stage is selectively enabled; and the disabled dummy differential transconductance amplifier stage comprises a gain substantially equal to the second gain.

3. The switched gain differential amplifier of claim 2 wherein:
the second differential transconductance amplifier stage comprises a plurality of differential transconductance amplifier stages coupled in parallel with one another and selectively enabled together as a block.

4. The switched gain differential amplifier of claim 1 wherein the first and second differential transconductance amplifier stages are alternately enabled.

5. The switched gain differential amplifier of claim 1 wherein:
the switched gain differential amplifier has a transconductance range of M to N, where M and N are transconductance values and M is greater than N;
the first and second differential transconductance amplifier stages are alternately enabled and comprise transconductances of M and N, respectively; and
the disabled dummy differential transconductance amplifier stage comprises a transconductance of M.

6. The switched gain differential amplifier of claim 1 wherein:
the switched gain differential amplifier has a transconductance range of M to N, where M and N are transconductance values and M is greater than N;
the first differential transconductance amplifier stage is permanently enabled and comprises a transconductance of N;
the second differential transconductance amplifier stage is selectively enabled and comprises a transconductance of M minus N; and
the disabled dummy differential transconductance amplifier stage comprises a transconductance of M minus N.

7. The switched gain differential amplifier of claim 1 wherein the first and second differential transconductance amplifier stages and the disabled dummy differential transconductance amplifier stage each comprises:
a differential transistor pair having first and second differential inputs, first and second differential outputs and a common current source node; and
a tail current source coupled to the common current source node.

8. A switched gain differential amplifier comprising:
first and second differential transconductance amplifier stages having respective differential inputs that are coupled in-phase to one another and respective differential outputs that are coupled in-phase to one another, wherein at least one of the first and second stages is selectively enabled and has a parasitic capacitance coupled between the differential input and the differential output of that stage; and
dummy differential transconductance amplifier stage means coupled between the differential inputs of the first and second differential transconductance amplifier stages and the differential outputs of the first and second differential transconductance amplifier stages for canceling the parasitic capacitance, wherein the dummy differential amplifier stage means is permanently disabled.

9. The switched gain differential amplifier of claim 8 wherein the dummy differential transconductance amplifier stage means comprises:

a differential input coupled in-phase to the differential inputs of the first and second differential transconductance amplifier stages; and
a differential output cross-coupled out-of-phase to the differential outputs of the first and second differential transconductance amplifier stages.

10. The switched gain differential amplifier of claim 8 and further comprising:
a common load circuit coupled to the differential outputs of the first and second differential transconductance amplifier stages and the dummy differential transconductance amplifier stage means.

11. The switched gain differential amplifier of claim 8 wherein:
the first and second differential transconductance amplifier stages comprise first and second gains, respectively, and the second gain is greater than the first gain;
the second differential transconductance amplifier stage is selectively enabled; and
the dummy differential transconductance amplifier stage means comprises a gain substantially equal to the second gain.

12. The switched gain differential amplifier of claim 11 wherein:
the second differential transconductance amplifier stage comprises a plurality of differential transconductance amplifier stages coupled in parallel with one another and selectively enabled together as a block.

13. The switched gain differential amplifier of claim 8 wherein the first and second differential transconductance amplifier stages are alternately enabled.

14. The switched gain differential amplifier of claim 8 wherein:
the switched gain differential amplifier has a transconductance range of M to N, where M and N are transconductance values and M is greater than N;
the first and second differential transconductance amplifier stages are alternately enabled and comprise transconductances of M and N, respectively; and
the dummy differential transconductance amplifier stage means comprises a transconductance of M.

15. The switched gain differential amplifier of claim 8 wherein:
the switched gain differential amplifier has a transconductance range of M to N, where M and N are transconductance values and M is greater than N;
the first differential transconductance amplifier stage is permanently enabled and comprises a transconductance of N;
the second differential transconductance amplifier stage is selectively enabled and comprises a transconductance of M minus N; and
the dummy differential transconductance amplifier stage means comprises a transconductance of M minus N.

16. The switched gain differential amplifier of claim 8 wherein the first and second differential transconductance amplifier stages and the dummy differential transconductance amplifier stage means each comprises:
a differential transistor pair having first and second differential inputs, first and second differential outputs and a common current source node; and
a tail current source coupled to the common current source node.

17. A method of canceling parasitic capacitance in a switched gain differential amplifier, the method comprising:

receiving a differential input signal;

amplifying the differential input signal with at least one of first and second differential transconductance amplifier stages having differential inputs that are coupled in-phase to one another and differential outputs that are coupled in-phase to one another, wherein at least one of the stages is selectively enabled and has a parasitic capacitance coupled between the differential input and the differential output of that stage; and canceling an effect of the parasitic capacitance with a permanently disabled dummy differential transconductance amplifier stage having a differential input coupled in-phase to the differential inputs of the first and second differential transconductance amplifier stages and a differential output cross-coupled out-of-phase to the differential outputs of the first and second differential transconductance amplifier stages.

* * * * *